(12) United States Patent
Yang et al.

(10) Patent No.: US 12,389,624 B2
(45) Date of Patent: Aug. 12, 2025

(54) HIGH ELECTRON MOBILITY TRANSISTOR AND METHOD FOR FORMING THE SAME

(71) Applicant: UNITED MICROELECTRONICS CORP., Hsin-Chu (TW)

(72) Inventors: Po-Yu Yang, Hsinchu (TW); Hsun-Wen Wang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/761,282

(22) Filed: Jul. 1, 2024

(65) Prior Publication Data
US 2024/0355920 A1 Oct. 24, 2024

Related U.S. Application Data

(63) Continuation of application No. 17/367,640, filed on Jul. 6, 2021, now Pat. No. 12,051,740.

(30) Foreign Application Priority Data

May 24, 2021 (CN) .......................... 202110563682.7

(51) Int. Cl.
H10D 30/47 (2025.01)
H10D 30/01 (2025.01)
(Continued)

(52) U.S. Cl.
CPC ......... *H10D 30/475* (2025.01); *H10D 30/015* (2025.01); *H10D 62/115* (2025.01); *H10D 64/021* (2025.01)

(58) Field of Classification Search
CPC ..... H10D 30/471–475; H10D 30/4755; H10D 30/015; H10D 62/115; H10D 62/116; H10D 62/824; H10D 62/8503; H10D 64/111; H10D 64/112; H10D 64/115; H10D 64/20; H10D 64/021; H10D 64/251; H10D 64/254; H10D 64/256; H10D 64/257; H10D 64/258; H10D 64/311; H10D 64/411; H10D 64/517; H10D 64/60; H10D 64/62; H01L 29/0657; H01L 29/1066; H01L 29/66462; H01L 29/7786; H01L 29/2003; H01L 29/0603; H01L 29/0684; H01L 29/205;
(Continued)

(56) References Cited

U.S. PATENT DOCUMENTS 5,449,929 A 9/1995 Hosogi
9,472,633 B1 10/2016 Schuette
(Continued)

FOREIGN PATENT DOCUMENTS

CN 111710715 A 9/2020
JP 11-274175 A 10/1999

*Primary Examiner* — Natalia A Gondarenko
(74) *Attorney, Agent, or Firm* — Winston Hsu

(57) ABSTRACT

A high electron mobility transistor includes an epitaxial stack on a substrate, a gate structure on the epitaxial stack, a passivation layer on the epitaxial stack and the gate structure, and an air gap between the passivation layer and the gate structure. The gate structure includes a semiconductor gate layer and a metal gate layer on the semiconductor gate layer. The air gap is in direct contact with a sidewall of the passivation layer, a sidewall of the metal gate layer, a sidewall and a top surface of the semiconductor gate layer.

8 Claims, 11 Drawing Sheets

(51) Int. Cl.
*H10D 62/10* (2025.01)
*H10D 64/01* (2025.01)

(58) Field of Classification Search
CPC ..... H01L 29/40; H01L 29/401; H01L 29/402; H01L 29/404; H01L 29/405; H01L 29/4236; H01L 29/0615; H01L 29/0619; H01L 29/42376; H01L 29/872; H01L 29/8725; H01L 29/0692; H01L 29/7787
USPC .................... 257/76, 77, 183, 190, 192, 194
See application file for complete search history.

(56) References Cited

U.S. PATENT DOCUMENTS

| | | |
|---|---|---|
| 10,714,607 B1 | 7/2020 | Chiang |
| 10,818,787 B1 | 10/2020 | Banerjee |
| 10,892,358 B1 | 1/2021 | Chang |
| 10,985,264 B2 | 4/2021 | Chen |
| 11,081,579 B2 | 8/2021 | Chang |
| 11,088,271 B2 | 8/2021 | Lee |
| 2004/0058485 A1 | 3/2004 | Makiyama |
| 2012/0175631 A1 | 7/2012 | Lidow |
| 2014/0264381 A1 | 9/2014 | Radulescu |
| 2015/0060946 A1 | 3/2015 | Makiyama |
| 2015/0295074 A1 | 10/2015 | Ozaki |
| 2017/0092752 A1 | 3/2017 | Lu |
| 2017/0207300 A1* | 7/2017 | Pei .................. H10D 62/824 |
| 2018/0219106 A1 | 8/2018 | Odnoblyudov |
| 2019/0157181 A1 | 5/2019 | Hobart |
| 2020/0235218 A1 | 7/2020 | Stoffels |
| 2022/0254894 A1 | 8/2022 | Constant |

\* cited by examiner

HIGH ELECTRON MOBILITY TRANSISTOR AND METHOD FOR FORMING THE SAME

CROSS REFERENCE TO RELATED APPLICATIONS

This application is a continuation application of U.S. application Ser. No. 17/367,640, filed on Jul. 6, 2021. The content of the application is incorporated herein by reference.

BACKGROUND OF THE INVENTION

1. Field of the Invention

The present invention relates to a high electron mobility transistor (HEMT) and method for forming the same. More particularly, the present invention relates to a high electron mobility transistor (HEMT) having an air gap adjacent to a gate structure thereof and method for forming the same.

2. Description of the Prior Art

A high electron mobility transistor (HEMT) is a new type of field effect transistor and usually includes a hetero stacked structure including stacked semiconductor layers. By bonding semiconductor layers with different band gaps, the energy band near the heterojunction between the semiconductor layers may bend and form a potential well. The free electrons in the semiconductor layers may converge into the potential well thereby forming a two-dimensional electron gas (2DEG) layer near the heterojunction. The two-dimensional electron gas layer may be utilized as a channel region of the HEMT to conduct current. In current semiconductor technology, group III-V semiconductor materials have been widely used for manufacturing HEMTs. Among them, gallium nitride (GaN) based materials have drawn a lot of attention for having wide band gaps, high breakdown voltages, high bonding strengths, and high thermal stabilities. The unique spontaneous polarization and piezoelectric polarization properties of the gallium nitride (GaN) based compounds materials may advance the formation of a two-dimensional electron gas layer with high electron concentration and high electron mobility, so that a higher switching speed and response frequency may be obtained. Due to these beneficial properties, GaN based materials have gradually replaced the silicon-based materials for forming semiconductor devices used in technical fields such as power converters, low noise amplifiers, radio frequency (RF) or millimeter wave (MMW).

However, the existing HEMTs still have problems need to be solved, such as current gain cut-off frequency ($f_T$) decrease caused by unfavorable gate parasitic capacitances and/or threshold voltage instability caused by dielectric charge traps, which may limit the high frequency performance of the HEMTs.

SUMMARY OF THE INVENTION

In light of the above, the present invention is directed to provide a high electron mobility transistor (HEMT) and method for forming the same, which particularly has an air gap formed by selectively removing an insulating layer and/or a spacer between the gate structure and the passivation layer of the HEMT through a selective wet etching process. In this way, the parasitic capacitances and gate leakage current caused by parasitic transistor near the edge of the gate structure may be reduced, so that an improved high frequency performance of the HEMT may be achieved.

According to one embodiment of the present invention, a high electron mobility transistor includes a substrate, a gate structure on the epitaxial stack, a passivation layer on the epitaxial stack and the gate structure, and an air gap between the passivation layer and the gate structure. The gate structure includes a semiconductor gate layer and a metal gate layer on the semiconductor gate layer. The air gap is in direct contact with a sidewall of the passivation layer, a sidewall of the metal gate layer, a sidewall and a top surface of the semiconductor gate layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
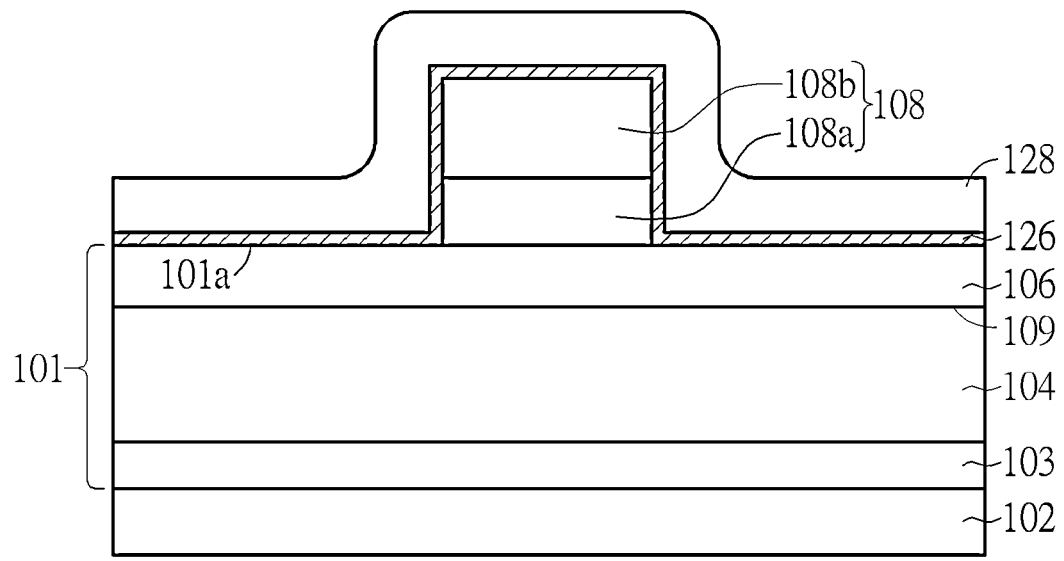
FIG. 1, FIG. 2, FIG. 3 and FIG. 4 are schematic cross-sectional views illustrating the steps for forming a high electron mobility transistor according to a first embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

FIG. 1, FIG. 2, FIG. 3 and FIG. 4 are schematic cross-sectional views illustrating the steps for forming a high electron mobility transistor according to a first embodiment of the present invention. FIG. 3A and FIG. 3B are schematic cross-sectional views illustrating some variants of the step shown in FIG. 3. Please refer to FIG. 1, a substrate 102 is provided. An epitaxial stack 101 is formed on the substrate 102. A gate structure 108 is formed on the epitaxial stack 101. An insulating layer 126 is formed on the epitaxial stack 101 and conformally covers the top surface 101a of the epitaxial stack 101 and the top surface and the sidewall of the gate structure 108. A passivation layer 128 is formed on the insulating layer 126.

The material of the substrate 102 may include silicon, silicon carbide (SiC), sapphire, gallium nitride (GaN), aluminum nitride (AlN), or other suitable materials, but is not limited thereto. The epitaxial stack 101 may include multiple layers that are successively formed on the substrate 102 through a heteroepitaxy growth process. According to an embodiment of the present invention, the epitaxial stack 101 may include, form the bottom (near the substrate 102) to the top (away from the substrate 102), a buffer layer 103, a channel layer 104, and a barrier layer 106. The buffer layer 103, the channel layer 104, and the barrier layer 106 of the epitaxial stack 101 may respectively include group III-V compound semiconductor materials, such as gallium nitride (GaN), aluminum gallium nitride (AlGaN), graded aluminum gallium nitride (graded AlGaN), aluminum indium nitride (AlInN), indium gallium nitride (InGaN), aluminum gallium indium nitride (AlGaInN), doped gallium nitride (doped GaN), aluminum nitride (AlN), or a combination thereof, but are not limited thereto. According to an embodiment of the present invention, the buffer layer 103 may include aluminum nitride (AlGaN), the channel layer 104 may include gallium nitride (GaN), and the barrier layer 106 may include aluminum gallium nitride (AlGaN). A two-dimensional electron gas layer (not shown) may be formed near the junction 109 between the barrier layer 106 and the channel layer 104. The two-dimensional electron gas layer may serve as a planar-type current channel when the high electron mobility transistor is at on-state.

In the illustrated embodiment shown in FIG. 1, the gate structure 108 of the high electron mobility transistor is a metal-semiconductor gate, which includes a semiconductor gate layer 108a and a metal gate layer 108b on the semiconductor gate layer 108a. The material of the semiconductor gate layer 108a may include an n-type (negative conductive type) semiconductor material or a p-type (positive conductive type) semiconductor material according to application needs. According to an embodiment of the present invention, the semiconductor gate layer 108a may include p-type gallium nitride (p-GaN) having dopants such as magnesium (Mg), iron (Fe) or other suitable p-type dopants. The material of the metal gate layer 108b may include a metal or a metal compound, such as gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above materials, a composite layer of the above materials, or an alloy of the above materials, but is not limited thereto. According to an embodiment of the present invention, the metal gate layer 108b may include titanium nitride (TiN). The method for forming the gate structure 108 may include the following steps. After forming the barrier layer 106, a semiconductor gate material layer (not shown) may be successively formed on the barrier layer 106 through the heteroepitaxy growth. After that, a metal gate material layer (not shown) may be formed on the semiconductor gate material layer through a chemical vapor deposition (CVD) process, a physical vapor deposition (PVD) process, or atomic layer deposition (ALD) process. Afterward, a patterning process such as a photolithography-etching process may be performed to pattern the metal gate material layer and the semiconductor gate material layer to form the metal gate layer 108b and the semiconductor gate layer 108a.

The insulating layer 126 and the passivation layer 128 may include dielectric materials, such as aluminum nitride (AlN), aluminum oxide ($Al_2O_3$), boron nitride (BN), silicon nitride (SiN), silicon oxide ($SiO_2$), zirconia ($ZrO_2$), hafnium oxide ($HfO_2$), lanthanum oxide ($La_2O_3$), lutetium oxide ($Lu_2O_3$), lanthanum oxide ($LaLuO_3$), high-k dielectric materials, other suitable dielectric materials, or a combination thereof, but are not limited thereto. It is important that the material of the insulating layer 126 is able to be selectively etched over the passivation layer 128 during the wet etching process E1 (shown in FIG. 3). According to an embodiment of the present invention, the insulating layer 126 may include aluminum oxide ($Al_2O_3$), and the passivation layer 128 may include silicon oxide ($SiO_2$).

Figure 2:
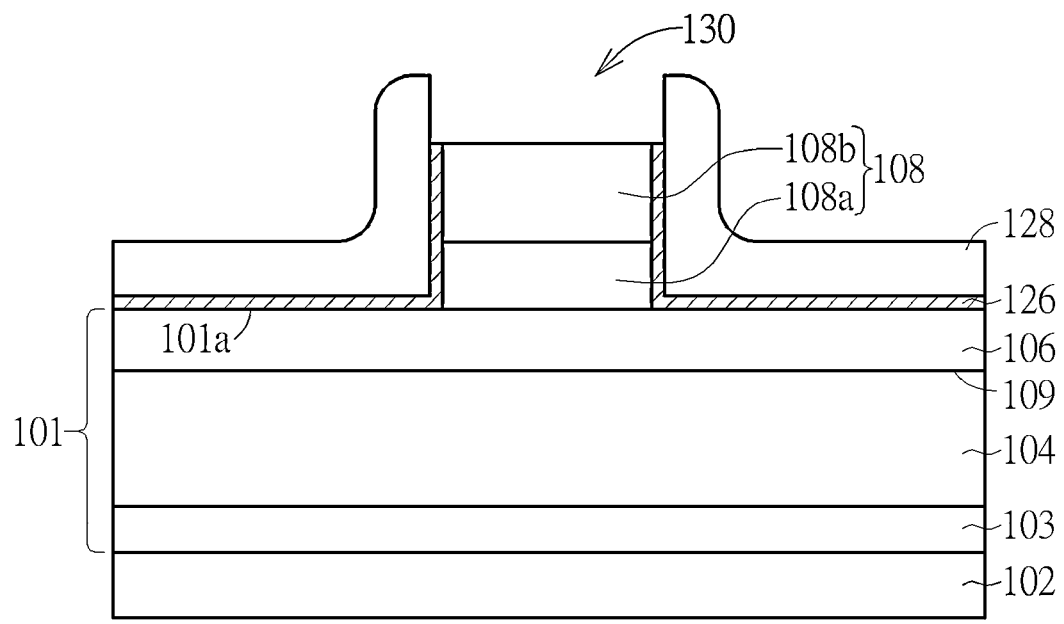

Please refer to FIG. 2. Subsequently, a patterning process such as a photolithography-etching process may be performed to remove a portion of the passivation layer 128 to form an opening 130 directly on the gate structure 108 and through the passivation layer 128 to expose a portion of the insulating layer 126. In some embodiments, as shown in FIG. 2, the insulating layer 126 on the top surface of the gate structure 108 may be removed during the patterning process. In other words, the opening 130 may penetrate through the insulating layer 126 and expose the top surface of the gate structure 108. In other embodiments, the bottom of the opening 130 may not penetrate through the insulating layer 126, and the top surface of the gate structure 108 is not exposed from the opening 130 by being covered by the insulating layer 126.

Figure 3:
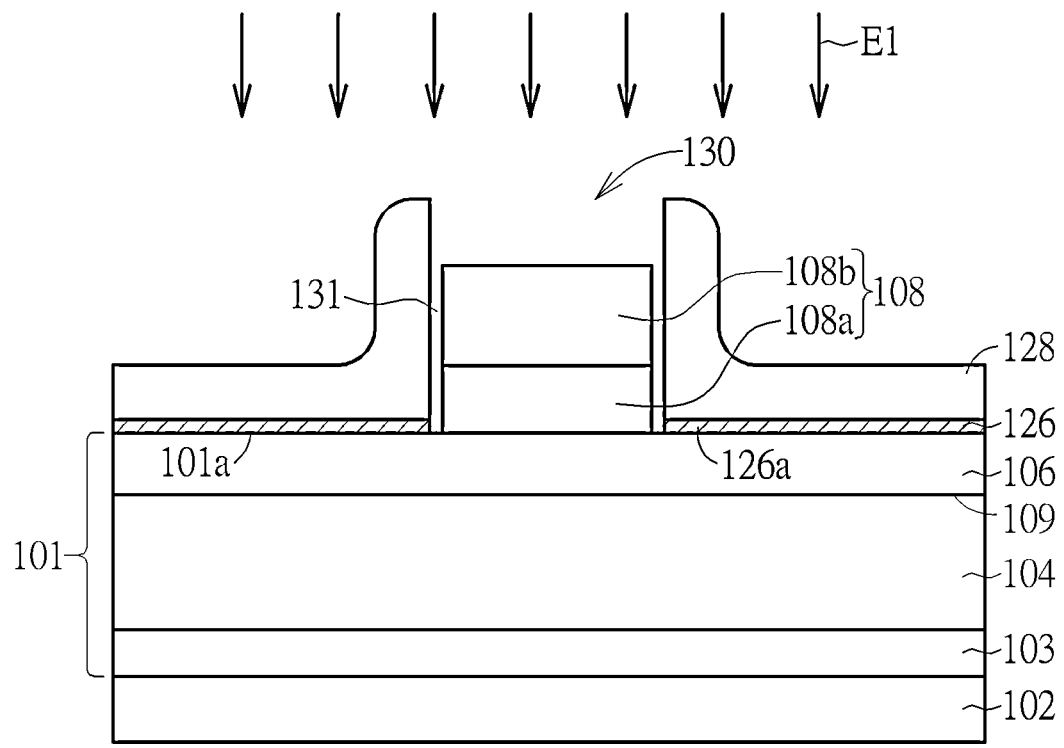
Figure 3A:
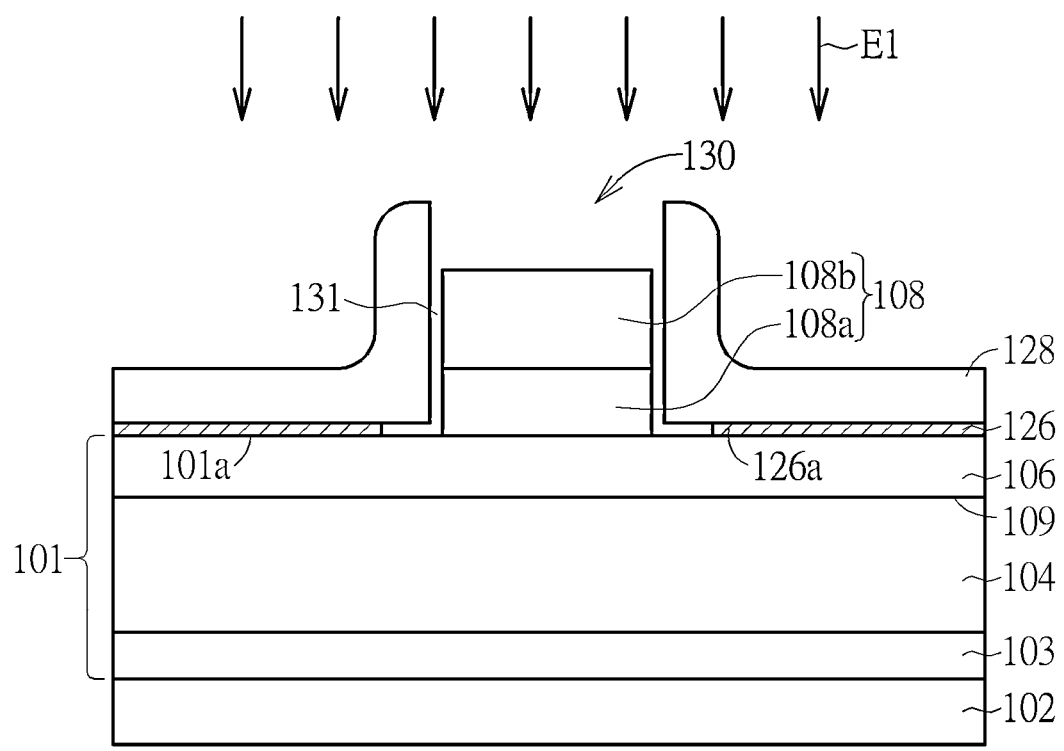
FIG. 3A and FIG. 3B are schematic cross-sectional views illustrating some variants of the step shown in FIG. 3.
Figure 3B:
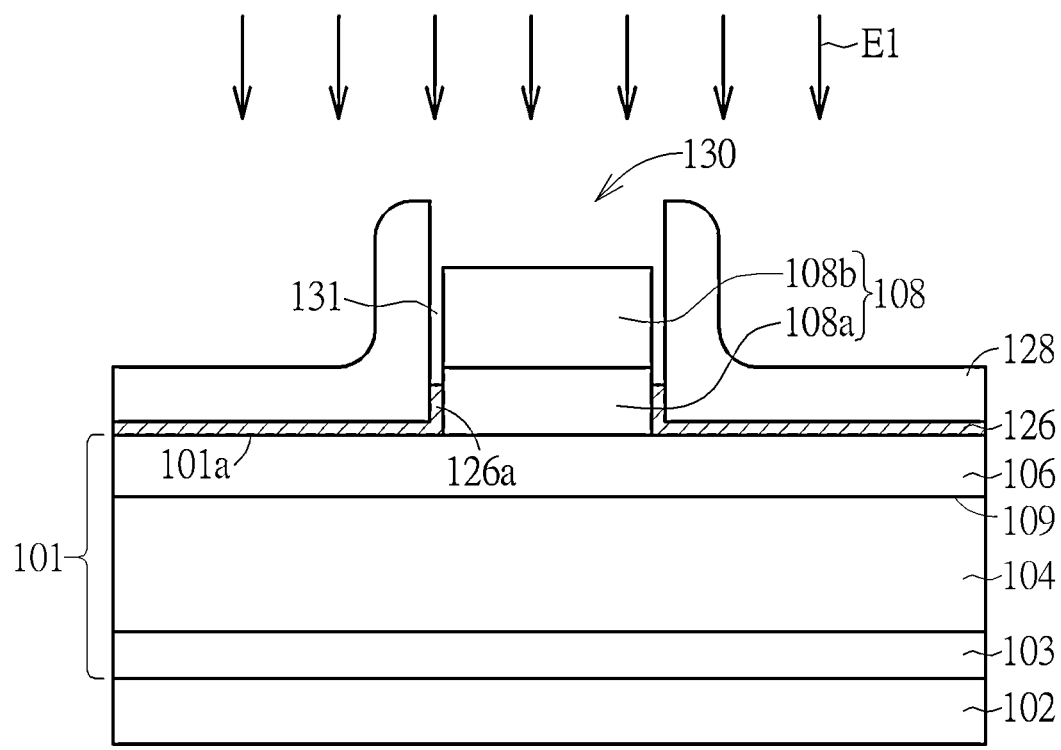

Please refer to FIG. 3, FIG. 3A and FIG. 3B. Subsequently, a wet etching process E1 is performed through the opening 130 to remove the insulating layer 126 on the sidewall of the gate structure 108, thereby forming an air gap 131 between the gate structure 108 and the passivation layer 128. The wet etching process E1 includes using an etchant that may selectively etch the insulating layer 126 over other materials exposed to the wet etching process E1. For example, the wet etching process E1 may include using ammonium hydroxide ($NH_4OH$), tetramethyl ammonium hydroxide (TMAH), and/or sulfuric acid ($H_2SO_4$) as etchant to etch the insulating layer 126 made of aluminum oxide ($Al_2O_3$). According to an embodiment of the present invention, the process temperature of the wet etching process E1 may be between 20° C. and 150° C., and the process time of the wet etching process E1 to etch the insulating layer 126 may be between 1 to 600 seconds, but are not limited thereto.

In some embodiments, as shown in FIG. 3, after the wet etching process E1, the end portion 126a of the insulating layer 126 may substantially flush with a sidewall of the passivation layer 128 opposite to the sidewall of the gate structure 108. In other embodiments, as shown in FIG. 3A, a portion of the insulating layer 126 between the passivation layer 128 and the epitaxial stack 101 may be etched and removed during the wet etching process E1, so that the end portion 126a of the insulating layer 126 may be farther away from the gate structure 108, and the air gap 131 may have an L-shape in the cross-sectional view, having a bottom lateral portion extending between the passivation layer 128 and the top surface 101a of the epitaxial stack 101. In still other embodiments, as shown in FIG. 3B, a portion of the insulating layer 126 may remain on the sidewall of the bottom portion of the gate structure 108 after the wet etching process E1, so that the end portion 126a of the insulating layer 126 may have an L-shape in the cross-sectional view.

Figure 4:
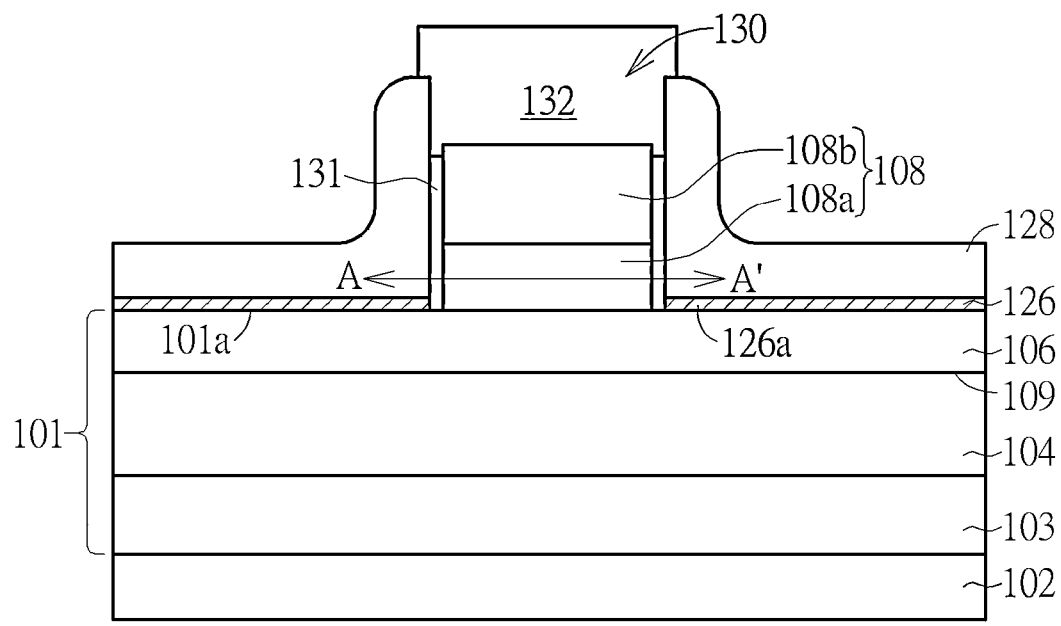

Please refer to FIG. 4. Subsequently, a gate electrode 132 is formed on the passivation layer 128 and fills into the opening 130. The gate electrode 132 directly contacts the metal gate layer 108b of the gate structure 108 and seals the air gap 131 between the sidewall of the gate structure 108 and the passivation layer 128. The material of the gate electrode 132 may include metal, such as gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above materials, a composite layer of the above materials, or an alloy of the above materials, but is not limited thereto. According to an embodiment of the present invention, the material of the gate electrode 132 may include aluminum (Al), copper (Cu), or an aluminum-copper alloy.

Please still refer to FIG. 4. The high electron mobility transistor provided by the first embodiment of the present invention includes a substrate 102, an epitaxial stack 101 disposed on the substrate 102, a gate structure 108 disposed on the epitaxial stack 101, a passivation layer 128 covering the epitaxial stack 101 and the gate structure 108, and an air gap 131 between the passivation layer 128 and the gate structure 108 and sealed by the gate electrode 132. The air gap 131 shown in FIG. 4 is in direct contact with the sidewall of the semiconductor gate layer 108a, the sidewall of the metal gate layer 108b, the top surface 101a of the epitaxial stack 101, and the end portion 126a of the insulation layer 126 between the passivation layer 128 and the epitaxial stack 101.

Figure 4A:
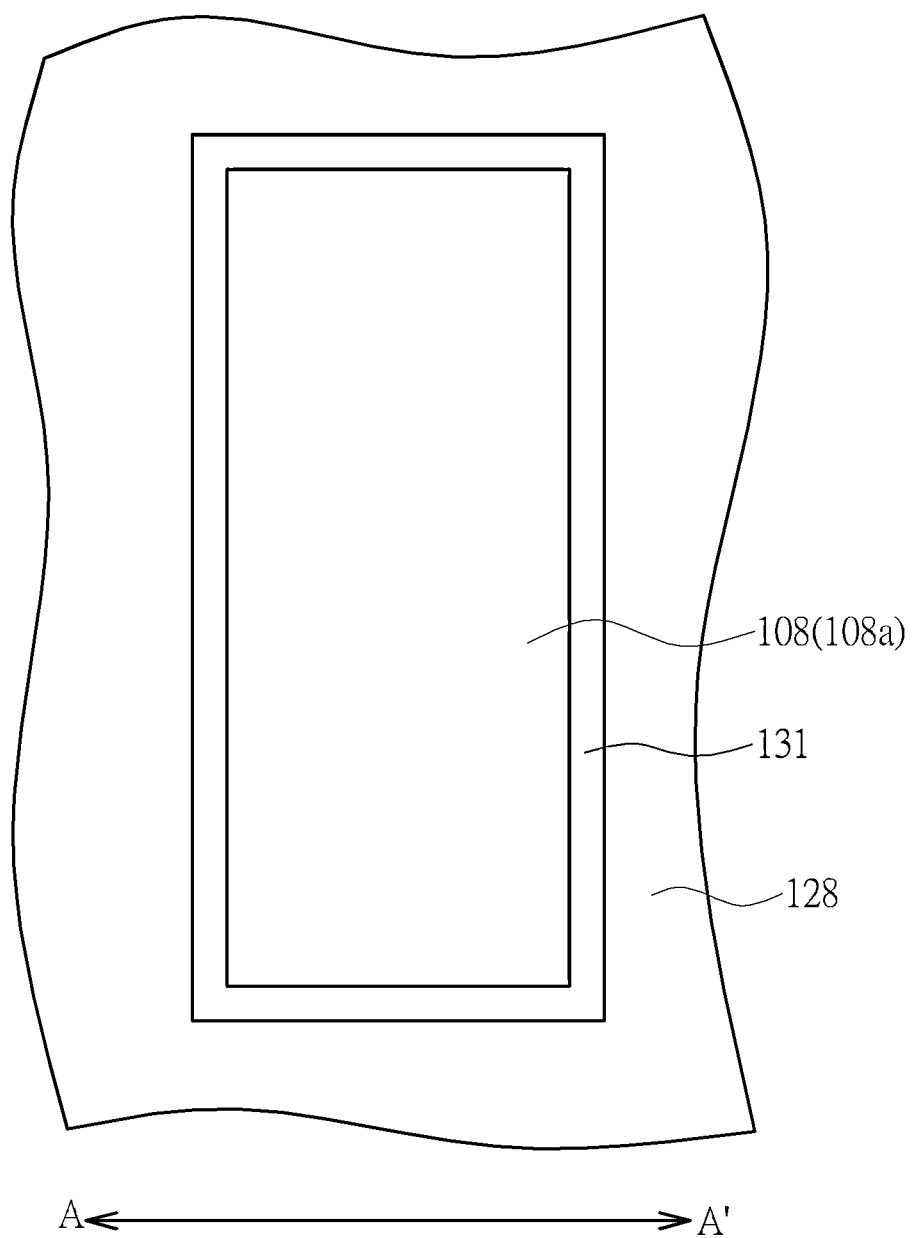
FIG. 4A is a schematic cross-sectional top view of a portion of the high electron mobility transistor along the line AA' shown in FIG. 4.
Figure 5:
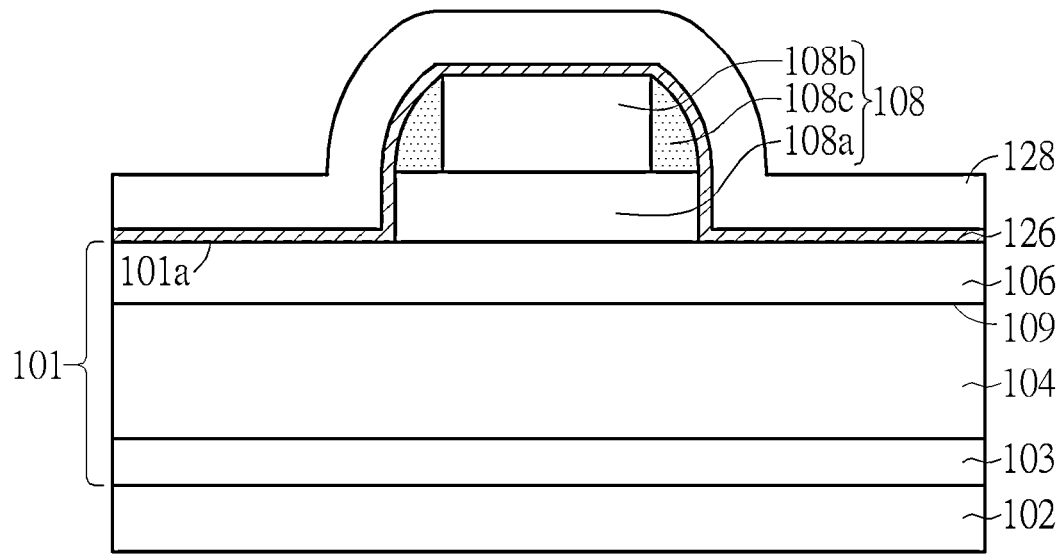
FIG. 5 to FIG. 8 are schematic cross-sectional views illustrating the steps for forming a high electron mobility transistor according to a second embodiment of the present invention.

Please refer to FIG. 4A, which shows a cross-sectional top view of a portion of the high electron mobility transistor along the line AA' shown in FIG. 4. In some embodiments, the gate structure 108 may be completely surrounded by the air gap 131. It should be noted that the shape of the gate structure 108 shown in FIG. 4A is a schematic example for illustrative purpose, and should not be taken as a limitation on the present invention. Since the air gap 131 has a dielectric constant lower than the insulating layer 126 and most of the dielectric materials, the air gap 131 formed between the gate structure 108 and the passivation layer 128 may reduce the gate parasitic capacitances, and therefore the current gain cut-off frequency ($f_T$) of the high electron mobility transistor may be increased. Furthermore, since the portion of the insulating layer 126 on the sidewall of the gate structure 108 is selectively removed, the threshold voltage instability problem caused by charge traps by the insulation layer 126 may be improved. Additionally, for a HEMT having a metal-semiconductor gate like the gate structure 108 shown in FIG. 4, the air gap 131 may reduce the formation of parasitic transistors near the edge of the semiconductor gate layer 108a, so that the gate leakage current caused by the parasitic transistor may be reduced. An increased power gain cut-off frequency ($f_{max}$) and a better high frequency performance may be achieved.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

FIG. 5 to FIG. 8 are schematic cross-sectional views illustrating the steps for forming a high electron mobility transistor according to a second embodiment of the present invention. A major difference between the first embodiment shown in FIG. 1 to FIG. 4 and the second embodiment shown in FIG. 5 to FIG. 8 is that, the gate structure 108 shown in FIG. 5 includes a spacer 108c on the semiconductor gate layer 108a and covering the sidewall of the metal gate layer 108b. According to an embodiment of the present invention, the gate structure 108 shown in FIG. 5 may be formed by the following steps. After forming the barrier layer 106, a semiconductor gate material layer (not shown) may be formed on the barrier layer 106. Subsequently, a metal gate material layer (not shown) may be formed on the semiconductor gate material layer and is then patterned to form the metal gate layer 108b. After that, a self-aligned spacer process may be performed to form the spacer 108c on the sidewall of the metal gate layer 108b. Afterward, an etching process may be performed, using the metal gate layer 108b and the spacer 108c as an etching mask to etch the semiconductor gate material layer, thereby forming the semiconductor gate layer 108a. The spacer 108c may include a dielectric material, such as aluminum nitride (AlN), aluminum oxide ($Al_2O_3$), boron nitride (BN), silicon nitride (SiN), silicon oxide ($SiO_2$), zirconia ($ZrO_2$), hafnium oxide ($HfO_2$), lanthanum oxide ($La_2O_3$), lutetium oxide ($Lu_2O_3$), lanthanum oxide ($LaLuO_3$), high-k dielectric materials, other suitable dielectric materials, or a combination thereof, but is not limited thereto. It is important that the material of the spacer 108c is able to be selectively etched over the insulating layer 126 and the passivation layer 128 during the wet etching process E1 (shown in FIG. 7). According to an embodiment of the present invention, the spacer 108c may include silicon nitride (SiN), the passivation layer 128 may include silicon oxide ($SiO_2$), and the insulating layer 126 may include aluminum oxide ($Al_2O_3$).

Figure 6:
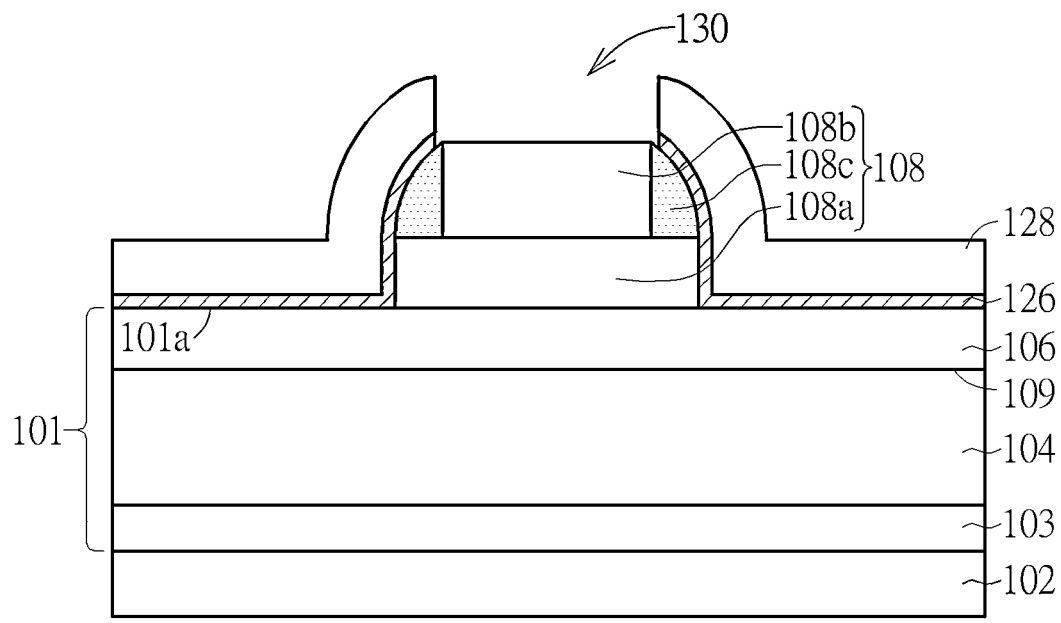

Please refer to FIG. 6. Subsequently, a patterning process such as a photolithography-etching process may be performed to remove a portion of the passivation layer 128 to form an opening 130 directly on the gate structure 108 and through the passivation layer 128 to expose a portion of the insulating layer 126. In some embodiments, as shown in FIG. 6, the insulating layer 126 on the top surface of the gate structure 108 may be removed during the patterning process. In other words, the opening 130 may penetrate through the insulating layer 126 and expose the top surface of the gate structure 108 and a portion of the spacer 108c. In other embodiments, the bottom of the opening 130 may not penetrate through the insulating layer 126, and the top surface of the gate structure 108 and the spacer 108c are not exposed from the opening 130 by being covered by the insulating layer 126.

Figure 7:
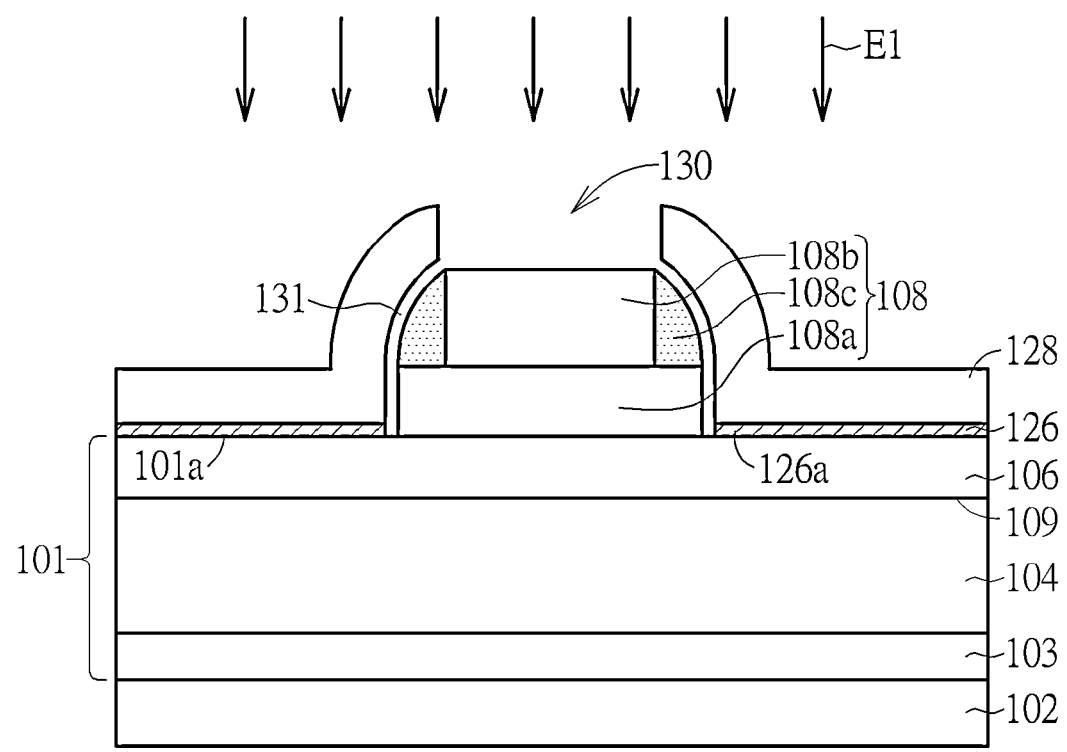

Please refer to FIG. 7. Subsequently, a wet etching process E1 is performed through the opening 130 to remove the insulating layer 126, thereby forming an air gap 131 between the gate structure 108 and the passivation layer 128. The etchant used in the wet etching process E1 and the process parameters of the wet etching process E1 may be referred to previous illustration, and will not be repeated herein.

Figure 8:
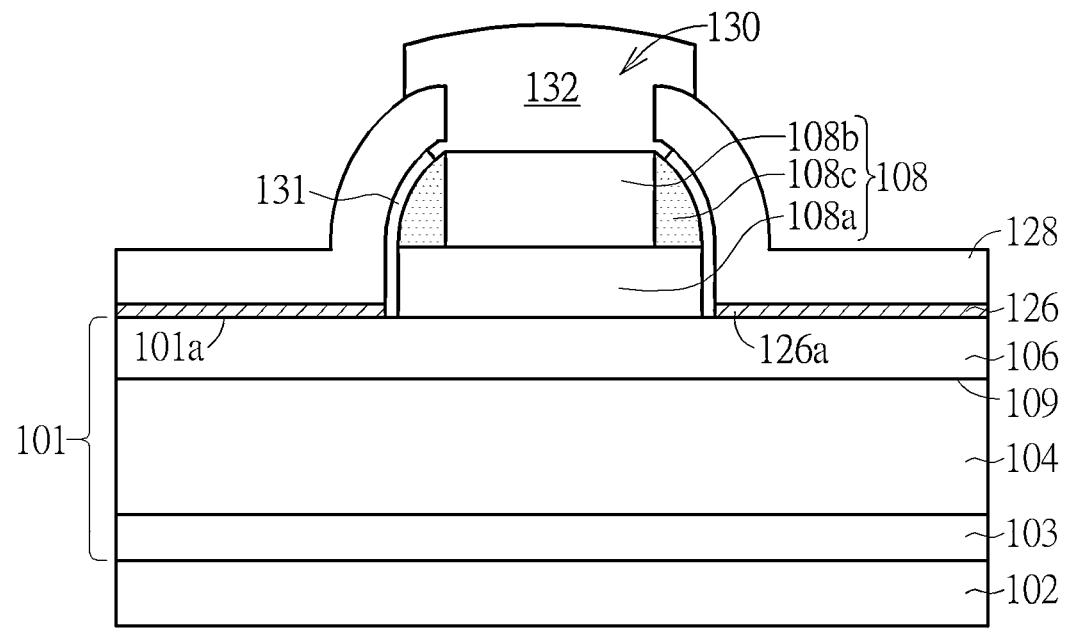

Please refer to FIG. 8. Subsequently, a gate electrode 132 is formed on the passivation layer 128 and fills into the opening 130. The gate electrode 132 directly contacts the metal gate layer 108b of the gate structure 108 and seals the air gap 131 between the gate structure 108 and the passivation layer 128. The material of the gate electrode 132 may be referred to previous illustration, and will not be repeated herein. As shown in FIG. 8, the air gap 131 directly contacts the sidewall of the spacer 108c, the sidewall of the semiconductor gate layer 108a, the top surface 101a of the epitaxial stack 101, and the end portion 126a of the insulating layer 126. It is noteworthy that, in this illustrated embodiment, the metal gate layer 108b is not in direct contact with the air gap 131 for being covered by the spacer 108c.

Figure 9:
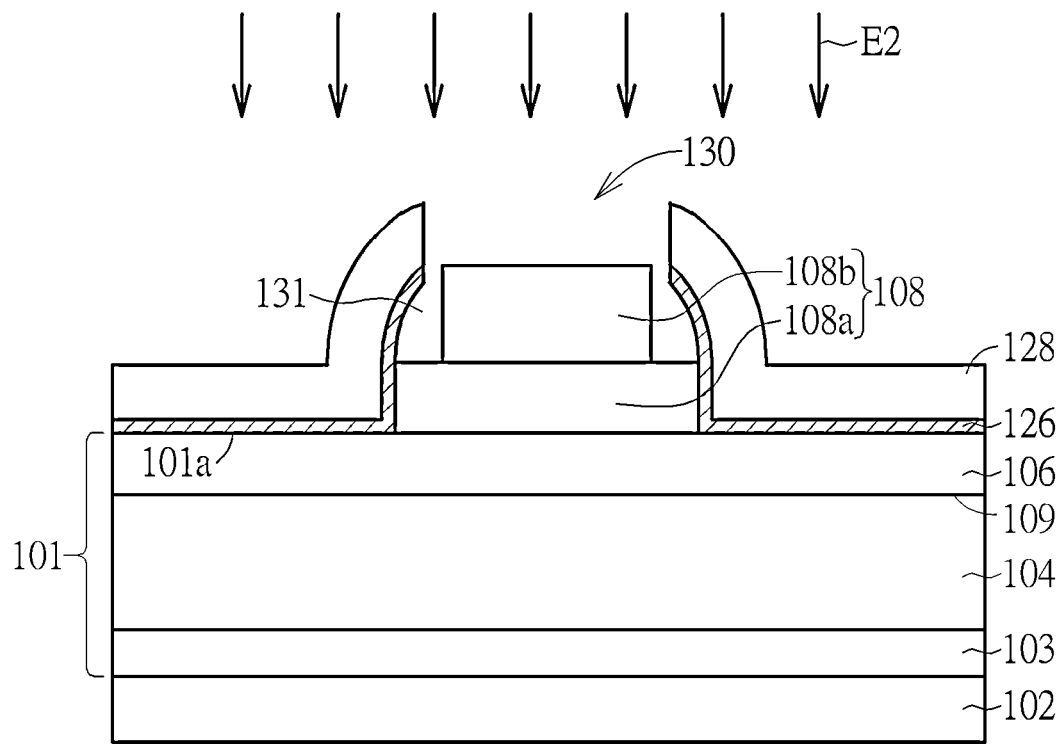
FIG. 9 and FIG. 10 are schematic cross-sectional views illustrating the steps for forming a high electron mobility transistor according to a third embodiment of the present invention.
Figure 10:
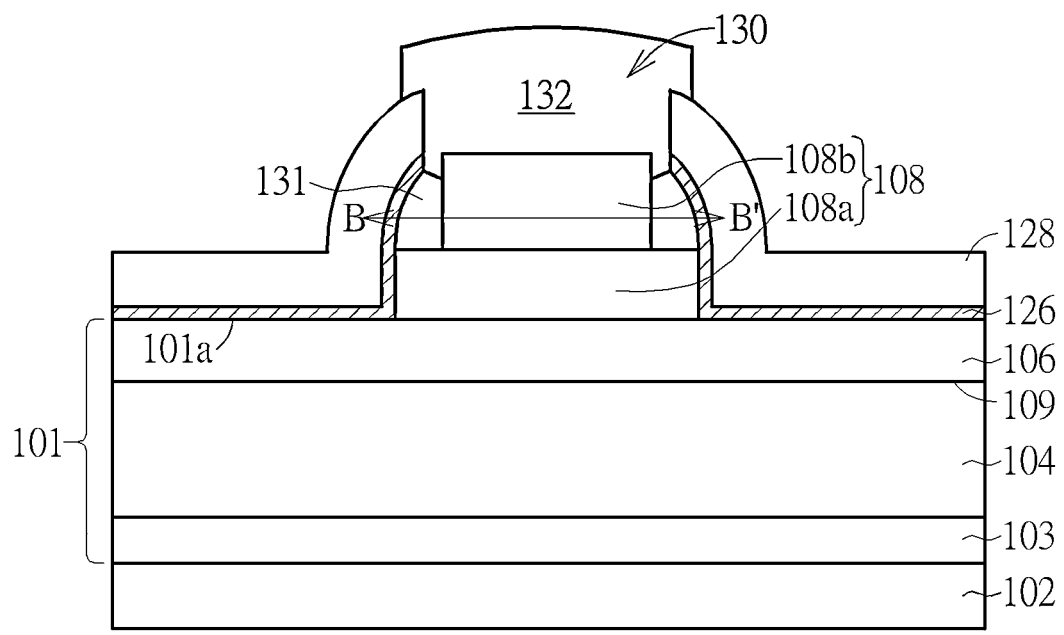

FIG. 9 and FIG. 10 are schematic cross-sectional views illustrating the steps for forming a high electron mobility transistor according to a third embodiment of the present invention. 10. Different from the step shown in FIG. 7 that the air gap is formed by removing the insulating layer, in the step show in FIG. 9, the air gap 131 is formed between the gate structure 108 and the insulating layer 126 by performing a wet etching process E2 through the opening 130 to remove at least a portion of the spacer 108c (shown in FIG. 6). The wet etching process E2 includes using an etchant that may selectively etch the spacer 108c over other materials exposed to the wet etching process E2. For example, the wet etching process E2 may include using phosphoric acid ($H_3PO_4$) as etchant to etch the spacer 108c made of silicon nitride (SiN). According to an embodiment of the present invention, the process temperature of the wet etching process E1 may be between 20° C. and 150° C., and the process time of the wet etching process E2 to etch the insulating layer 126 may be between 1 to 600 seconds, but are not limited thereto.

Please refer to FIG. 10. Subsequently, a gate electrode 132 is formed on the passivation layer 128 and fills into the opening 130 to directly contact the metal gate layer 108b of the gate structure 108 and seal the air gap 131. As shown in FIG. 10, the air gap 131 is between the insulating layer 126, the top surface of the semiconductor gate layer 108a, and the sidewall of the metal gate layer 108b. The sidewall of the semiconductor gate layer 108a and the top surface 101a of the epitaxial stack 101 are not in direct contact with the air gap 131 by being covered by the insulating layer 126. According to an embodiment of the present invention, the spacer 108c may be completely removed by the wet etching process E2, so that the air gap 131 may have a spacer-like shape.

Figure 10A:
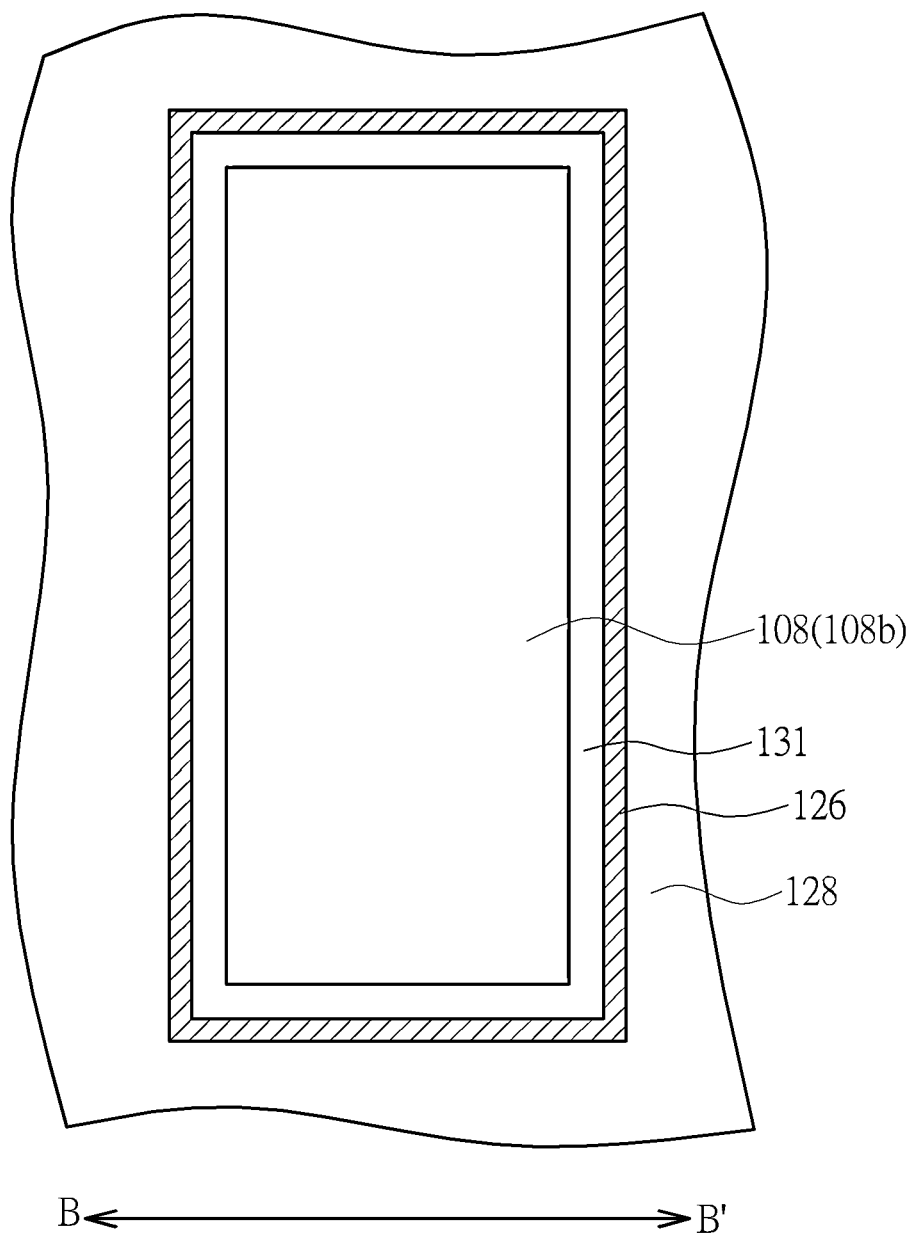
FIG. 10A is a schematic cross-sectional top view of a portion of the high electron mobility transistor along the line BB' shown in FIG. 10.

Please refer to FIG. 10A, which is a schematic cross-sectional top view of a portion of the high electron mobility transistor along the line BB' shown in FIG. 10. In some embodiments, the gate structure 108 may be completely surrounded by the air gap 131, and the air gap 131 may be completely surrounded by the insulating layer 126. It should be noted that the shape of the gate structure 108 shown in FIG. 10 is a schematic example for illustrative purpose, and should not be taken as a limitation on the present invention.

Figure 11:
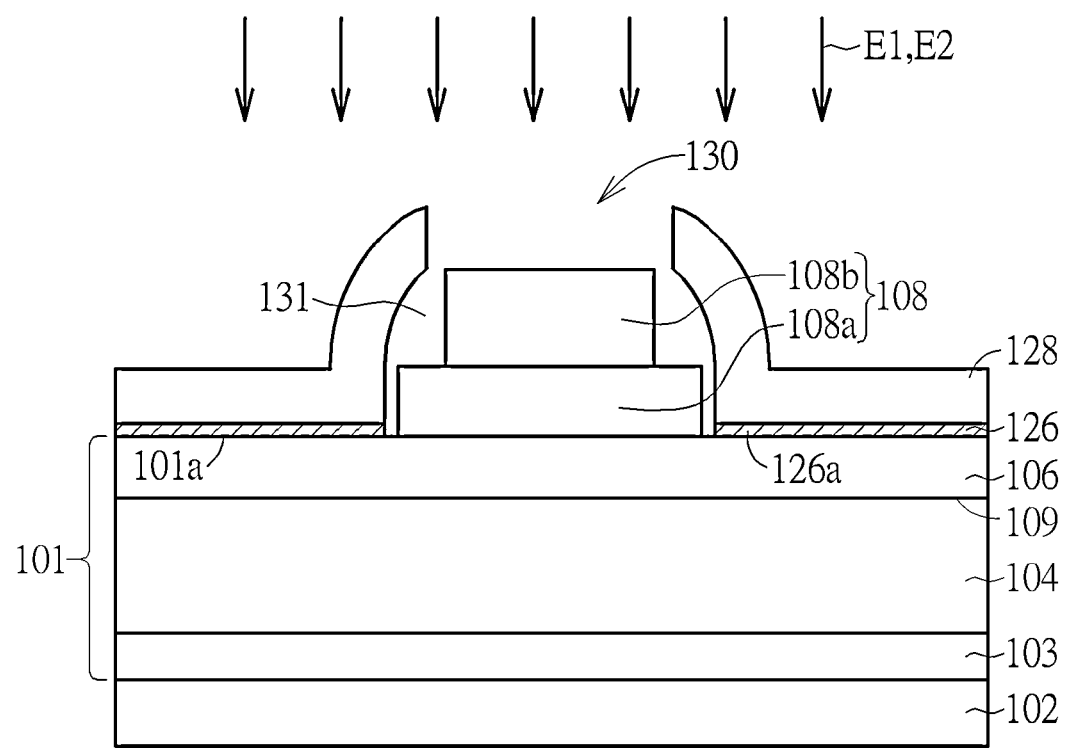
FIG. 11 and FIG. 12 are schematic cross-sectional views illustrating the steps for forming a high electron mobility transistor according to a fourth embodiment of the present invention.
Figure 12:
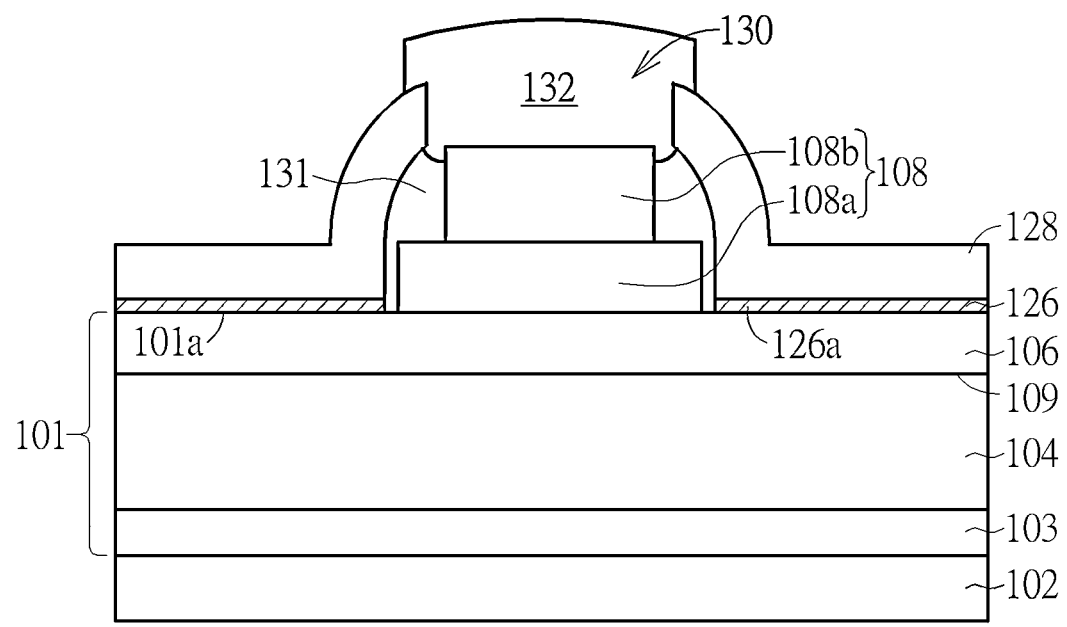

FIG. 11 and FIG. 12 are schematic cross-sectional views illustrating the steps for forming a high electron mobility transistor according to a fourth embodiment of the present invention. Different from the step shown in FIG. 7 that the air gap is formed by removing the insulating layer, in the step shown in FIG. 11, the air gap 131 is formed between the gate structure 108 and the insulating layer 126 by performing the wet etching process E1 and the wet etching process E2 to remove a portion of the insulating layer 126 and at least a portion of the spacer 108c. The etchants and process parameters such as process temperatures and process times of the wet etching process E1 and the wet etching process E2 may be referred to previous illustration, and will not be repeated herein. Subsequently, as shown in FIG. 12, a gate electrode 132 is formed on the passivation layer 128 and fills into the opening 130 to directly contact the metal gate layer 131 and seal the air gap 131 between the passivation layer 128 and the gate structure 108. The air gap 131 of the high electron mobility transistor shown in FIG. 12 is in direct contact with the sidewall of the metal gate layer 108b, the top surface and sidewall of the semiconductor gate layer 108a, the top surface 101a of the epitaxial stack 101, and the end portion 126a of the insulating layer 126.

Figure 13:
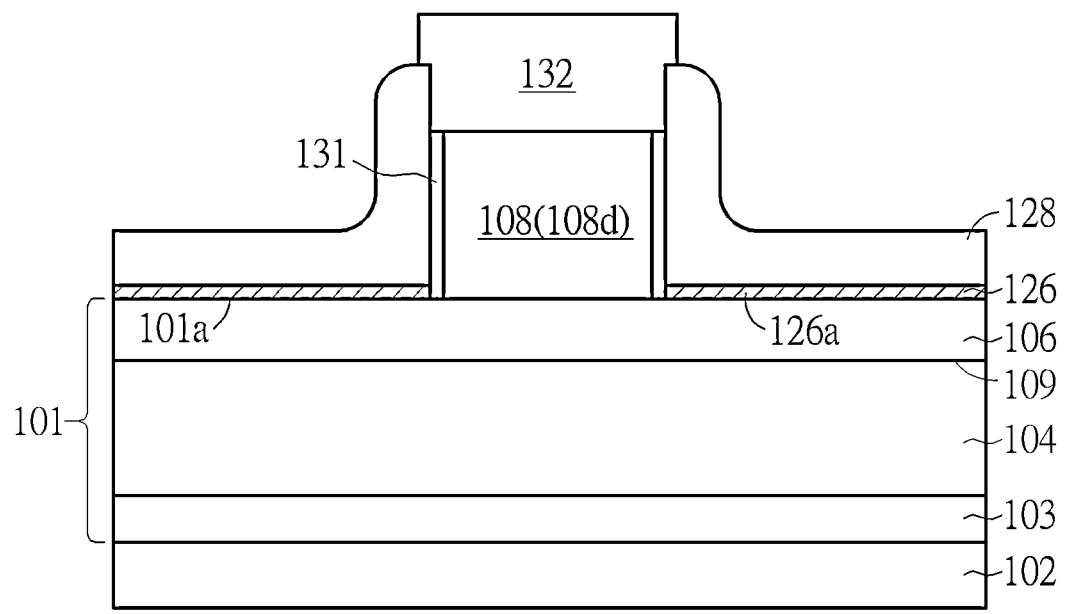
FIG. 13 is a schematic cross-sectional view of a high electron mobility transistor according to a fifth embodiment of the present invention.
Figure 14:
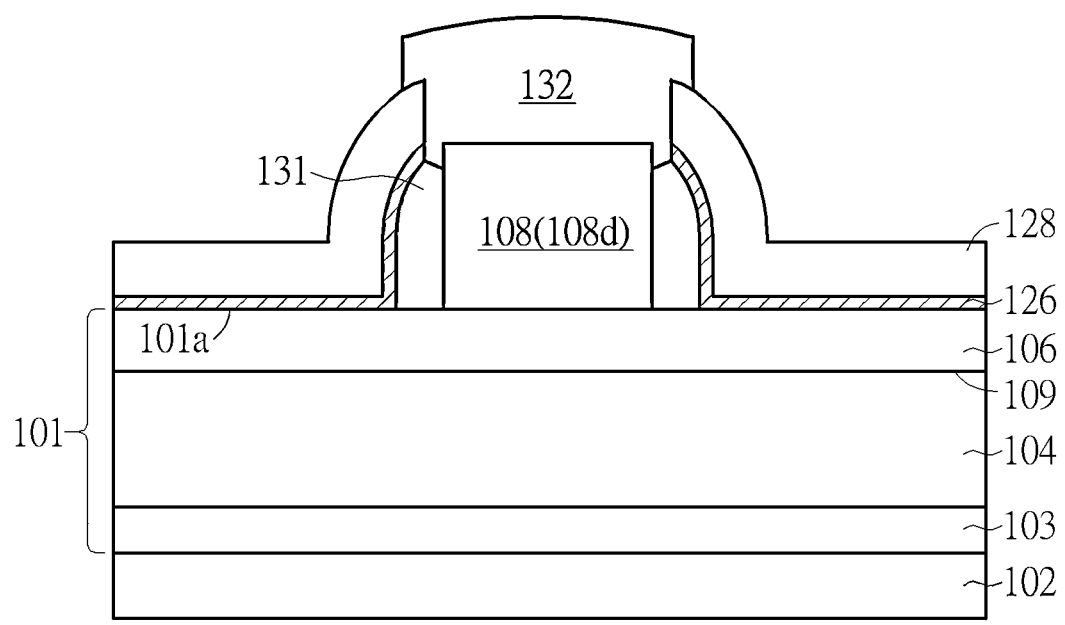
FIG. 14 is a schematic cross-sectional view of a high electron mobility transistor according to a sixth embodiment of the present invention.
Figure 15:
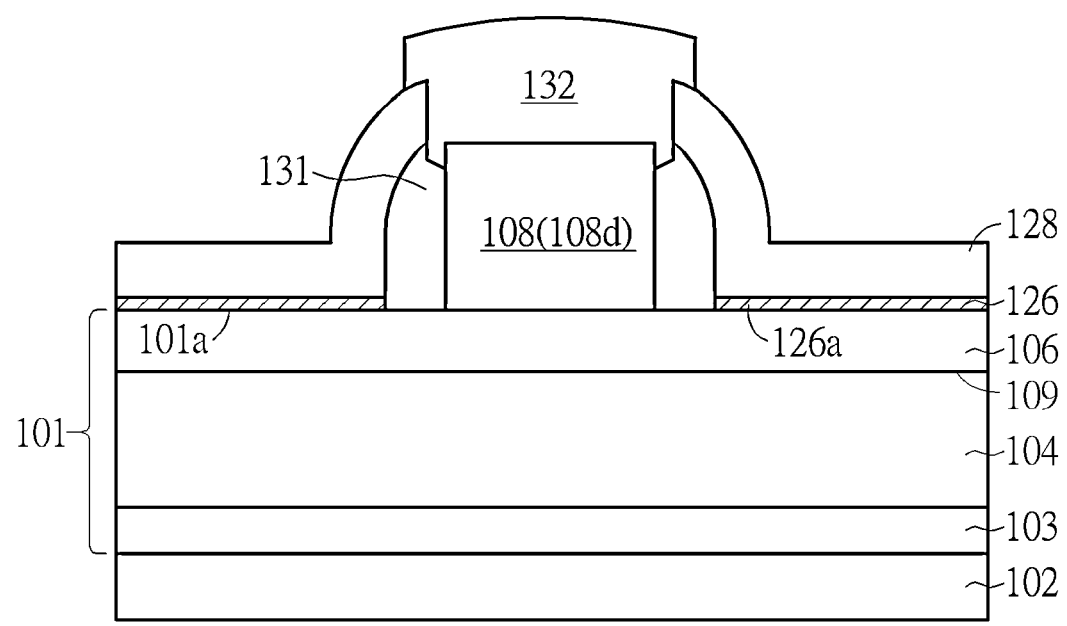
FIG. 15 is a schematic cross-sectional view of a high electron mobility transistor according to a seventh embodiment of the present invention.

FIG. 13, FIG. 14, and FIG. 15 are schematic cross-sectional views of some high electron mobility transistors according to a fifth, a sixth, and a seventh embodiments of the present invention. Different from the high electron mobility transistors shown in FIG. 4, FIG. 8 and FIG. 12 that respectively have a metal-semiconductor gate, the high electron mobility transistors shown in FIG. 13, FIG. 14 and FIG. 15 respectively have a metal gate. That is, the gate structure 108 of the high electron mobility transistors shown in FIG. 13, FIG. 14 and FIG. 15 is formed by a metal gate layer 108d in a monolithic manner. The metal gate layer 108d may directly contact the barrier layer 106, or may be separated from the barrier layer 106 by a gate dielectric layer (not shown) therebetween. The material of the metal gate layer 108d may include a metal or a metal compound, such as gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above materials, a composite layer of the above materials, or an alloy of the above materials, but is not limited thereto. According to an embodiment of the present invention, the metal gate layer 108d may include nickel (Ni), nickel/titanium (Ni/Ti), nickel/aluminum (Ni/Al), nickel/gold (Ni/Au), or tantalum nitride (TaN). In the fifth embodiment shown in FIG. 13, an air gap 131 is formed between the metal gate layer 108d and the passivation layer 128 of the high electron mobility transistor by removing a portion of the insulating layer 126 on the side wall of the metal gate layer 108d through, for example, the wet etching process E1 as shown in FIG. 3. In the sixth embodiment shown in FIG. 14, an air gap 131 is formed between the metal gate layer 108d and the insulating layer 126 of the high electron mobility transistor by removing a spacer (not shown) on the sidewall of the metal gate layer 108d through, for example, the wet etching process E2 as shown in FIG. 9, so that the air gap 131 may have a spacer-like shape. In the seventh embodiment shown in FIG. 15, an air gap 131 is formed between the metal gate layer 108d and the passivation layer 128 by removing a portion of the insulating layer 126 and at least a portion of a spacer (not shown) on the sidewall of the metal gate layer 108*d* through, for example, the wet etching process E1 as shown in FIG. 3 and the wet etching process E2 as shown in FIG. 9.

In summary, the present invention provides a high electron mobility transistor having an air gap formed by selectively removing an insulating layer and/or a spacer between the gate structure and the passivation layer. The air gap formed between the gate structure and the passivation layer may reduce the gate parasitic capacitances and the dielectric charge traps near the gate structure. Furthermore, for a high electron mobility transistor having a metal-semiconductor gate, the air gap may also reduce the formation of parasitic transistors near the edge of the semiconductor gate layer, so that the gate leakage current caused by the parasitic transistor may be reduced. Overall, the high electron mobility transistor provided by the present invention may have an improved high frequency performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor, comprising:
   an epitaxial stack on a substrate;
   a gate structure on the epitaxial stack, wherein the gate structure comprises a semiconductor gate layer and a metal gate layer on the semiconductor gate layer;
   a passivation layer on the epitaxial stack and the gate structure; and
   an air gap between the passivation layer and the gate structure and comprising:
      a first portion in direct contact with a sidewall of the passivation layer, a sidewall of the metal gate layer and a top surface of the semiconductor gate layer;
      a second portion in direct contact with a sidewall of the semiconductor gate layer and a top surface of the epitaxial stack; and
      a third portion between a bottom surface of the passivation layer and the top surface of the epitaxial stack, wherein the second portion and the third portion form an L shape.

2. The high electron mobility transistor according to claim 1, wherein a top surface of the epitaxial stack next to the sidewall of the semiconductor gate layer is in direct contact with the air gap.

3. The high electron mobility transistor according to claim 1, further comprising a gate electrode disposed on the passivation layer and the metal gate layer and sealing the air gap.

4. The high electron mobility transistor according to claim 1, further comprising an insulating layer disposed between the epitaxial stack and the passivation layer, wherein an end portion of the insulating layer is between the bottom surface of the passivation layer and the top surface of the epitaxial stack and in direct contact with the air gap.

5. The high electron mobility transistor according to claim 4, wherein the insulating layer comprises aluminum oxide ($Al_2O_3$), and the passivation layer comprises silicon oxide ($SiO_2$).

6. The high electron mobility transistor according to claim 1, wherein the epitaxial stack comprises:
   a buffer layer on the substrate;
   a channel layer on the buffer layer; and
   a barrier layer on the channel layer, wherein the semiconductor gate layer is on the barrier layer.

7. The high electron mobility transistor according to claim 1, wherein the buffer layer comprises aluminum nitride (AlGaN), the channel layer comprises gallium nitride (GaN), and the barrier layer comprises aluminum gallium nitride (AlGaN).

8. The high electron mobility transistor according to claim 1, wherein the semiconductor gate layer comprises p-type gallium nitride (p-GaN).

\* \* \* \* \*